United States Patent
Walker et al.

(10) Patent No.: US 8,418,116 B2
(45) Date of Patent: Apr. 9, 2013

(54) ZONE-BASED OPTIMIZATION FRAMEWORK FOR PERFORMING TIMING AND DESIGN RULE OPTIMIZATION

(75) Inventors: Robert Walker, Boulder, CO (US); Mahesh A. Iyer, Fremont, CA (US); Amir H. Mottaez, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 279 days.

(21) Appl. No.: 12/697,168

(22) Filed: Jan. 29, 2010

(65) Prior Publication Data

US 2011/0191740 A1 Aug. 4, 2011

(51) Int. Cl.
*G06F 17/50* (2006.01)
(52) U.S. Cl.
USPC .............. 716/132; 716/110; 716/135
(58) Field of Classification Search .......... 716/110, 716/111, 120, 132, 135
See application file for complete search history.

(56) References Cited

U.S. PATENT DOCUMENTS

| | | | |
|---|---|---|---|
| 6,209,123 B1 * | 3/2001 | Maziasz et al. | 716/123 |
| 7,383,521 B2 * | 6/2008 | Smith et al. | 716/114 |
| 2001/0010090 A1 | 7/2001 | Boyle | |
| 2003/0229410 A1 * | 12/2003 | Smith et al. | 700/109 |
| 2005/0114808 A1 | 5/2005 | McBride | |
| 2008/0288901 A1 | 11/2008 | Barowski | |

* cited by examiner

*Primary Examiner* — Thuan Do
*Assistant Examiner* — Mohammed Alam
(74) *Attorney, Agent, or Firm* — Park, Vaughan, Fleming & Dowler, LLP; Laxman Sahasrabuddhe

(57) ABSTRACT

Some embodiments of the present invention provide techniques and systems for efficiently optimizing a circuit design for one or more multi-mode multi-corner (MCMM) scenarios. A system can select an optimizing transformation for a logic gate, which if applied to the logic gate, does not degrade a timing metric in a local context of the logic gate. Next, the system can determine whether applying the optimizing transformation to the logic gate degrades the timing metric in a zone around the logic gate. If so, the system can reject the optimizing transformation. Otherwise, the system can determine whether applying the optimizing transformation to the logic gate degrades the timing metric in the circuit design. If so, the system can reject the optimizing transformation. Otherwise, the system can accept the optimizing transformation.

20 Claims, 7 Drawing Sheets

ZONE-BASED OPTIMIZATION FRAMEWORK FOR PERFORMING TIMING AND DESIGN RULE OPTIMIZATION

BACKGROUND

1. Technical Field

This disclosure relates to electronic design automation (EDA). More specifically, this disclosure relates to a zone-based optimization framework for performing timing and design rule optimization.

2. Related Art

Conventional circuit optimization techniques force a timing update of the entire design whenever a logic gate is changed. Updating arrival and required times for the entire circuit is computationally expensive. In fact, the worst-case complexity of a full timing update can be exponential with respect to the circuit design's size. As a result, the timing update operation often becomes a runtime bottleneck in conventional synthesis optimization systems (e.g., logic synthesis and physical synthesis).

To combat the runtime bottleneck problem, conventional techniques typically impose a time limit on the optimization process. Although this approach ensures that the optimization process is guaranteed to terminate within the predetermined amount of time, it results in poor QoR.

The problems with conventional approaches—e.g., the long runtimes and the poor QoR—are further exacerbated when a design needs to be optimized for a large number of multi-mode multi-corner (MCMM) scenarios. This is because conventional approaches optimize each scenario independently. In fact, in the MCMM case, conventional techniques often fail to converge on an optimal solution.

Hence, what is needed are efficient circuit optimization techniques which produce good QoR.

SUMMARY

Some embodiments of the present invention provide techniques and systems for efficiently optimizing a circuit design for one or more multi-mode multi-corner (MCMM) scenarios.

A system can select an optimizing transformation for a logic gate, which if applied to the logic gate, does not degrade a timing metric in a local context of the logic gate. The local context of a logic gate can generally be any portion of the circuit design that includes the logic gate. For example, the local context of the logic gate can include the logic gate, the logic gate's fan-in, and the logic gate's fan-out. The optimizing transformation can be selected for fixing timing violations and/or electrical design rule violations. The system can try a large number of optimizing transformation in the local context and select the best transformation based on some evaluation criteria. A timing violation can be a worst negative slack violation, a total negative slack violation, and/or a maximum transition time violation. A electrical design rule violation can be a maximum capacitance violation. The timing metric can be a worst negative slack metric, a total negative slack metric, a maximum transition time metric, or a combination of one or more of these metrics.

In some embodiments, the system can select an optimizing transformation for a logic gate, which if applied to the logic gate, does not degrade a timing metric in a local context of the logic gate under a focus MCMM scenario in a set of MCMM scenarios. The focus MCMM scenario is an MCMM scenario of particular interest. For example, when delay optimization is performed to fix a delay violation, the focus MCMM scenario can be the MCMM scenario in which the delay violation occurred.

Next, the system can determine whether applying the optimizing transformation to the logic gate degrades the timing metric in a zone around the logic gate. In some embodiments, the system can determine the timing metric under each MCMM scenario in the set of MCMM scenarios. A zone around the logic gate can generally be any portion of the circuit design that includes the local context of the logic gate. Specifically, the zone around the logic gate can include the logic gate, the logic gate's fan-in, logic gates within a first predetermined number of levels in the logic gate's fan-out, and a second predetermined number of levels in the logic gate's fan-in's fan-out.

If the system determines that applying the optimizing transformation to the logic gate degrades the timing metric in the zone, the system can reject the optimizing transformation. In the MCMM case, the system can reject the optimization transformation if the timing metric degrades under even one MCMM scenario.

On the other hand, if the system determines that applying the optimizing transformation to the logic gate does not degrade the timing metric in the zone, the system can then determine whether applying the optimizing transformation to the logic gate degrades the timing metric in the circuit design.

If the system determines that applying the optimizing transformation to the logic gate degrades the timing metric in the circuit design, the system can reject the optimizing transformation. Again, in the MCMM case, the system can reject the optimization transformation if the timing metric degrades under even one MCMM scenario. On the other hand, if system determines that applying the optimizing transformation to the logic gate does not degrade the timing metric in the circuit design, the system can accept the optimizing transformation.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
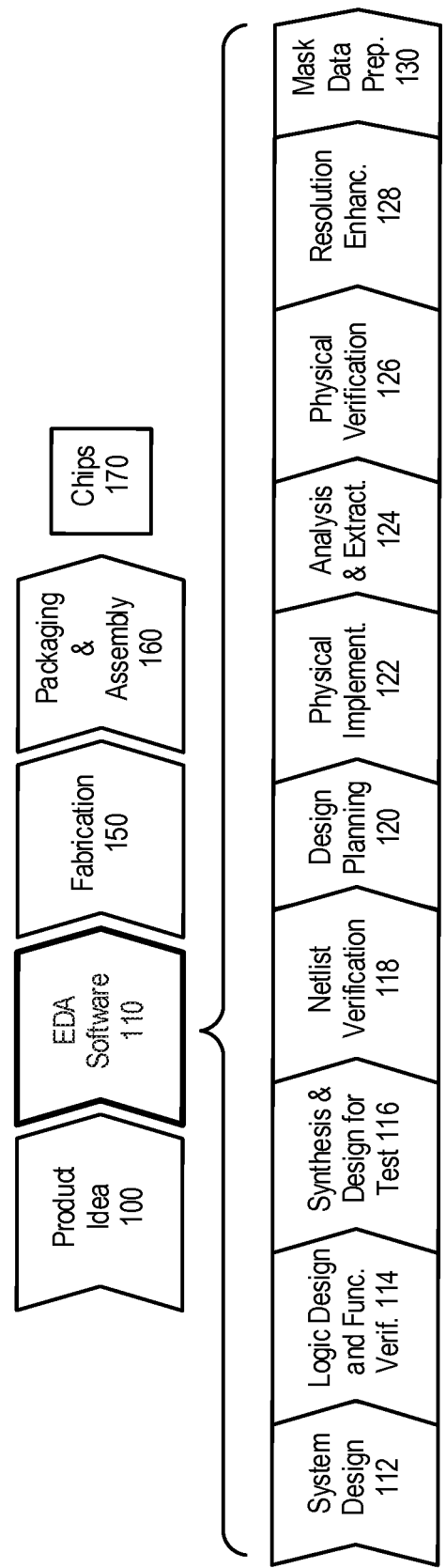
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a VHDL or Verilog design can be created and checked for functional accuracy.

In the synthesis and design step 116, the VHDL/Verilog code can be translated to a netlist, which can be optimized for the target technology. Further, in this step, tests can be designed and implemented to check the finished chips. In the netlist verification step 118, the netlist can be checked for compliance with timing constraints and for correspondence with the VHDL/Verilog code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to ensure correctness for manufacturing, electrical issues, lithographic issues, and circuitry.

In the resolution enhancement step 128, geometric manipulations can be performed on the layout to improve manufacturability of the design. Finally, in the mask data preparation step 130, the design can be taped-out for production of masks to produce finished chips.

Embodiments of the present invention can be used in one or more of the above-described steps.

Figure 2:
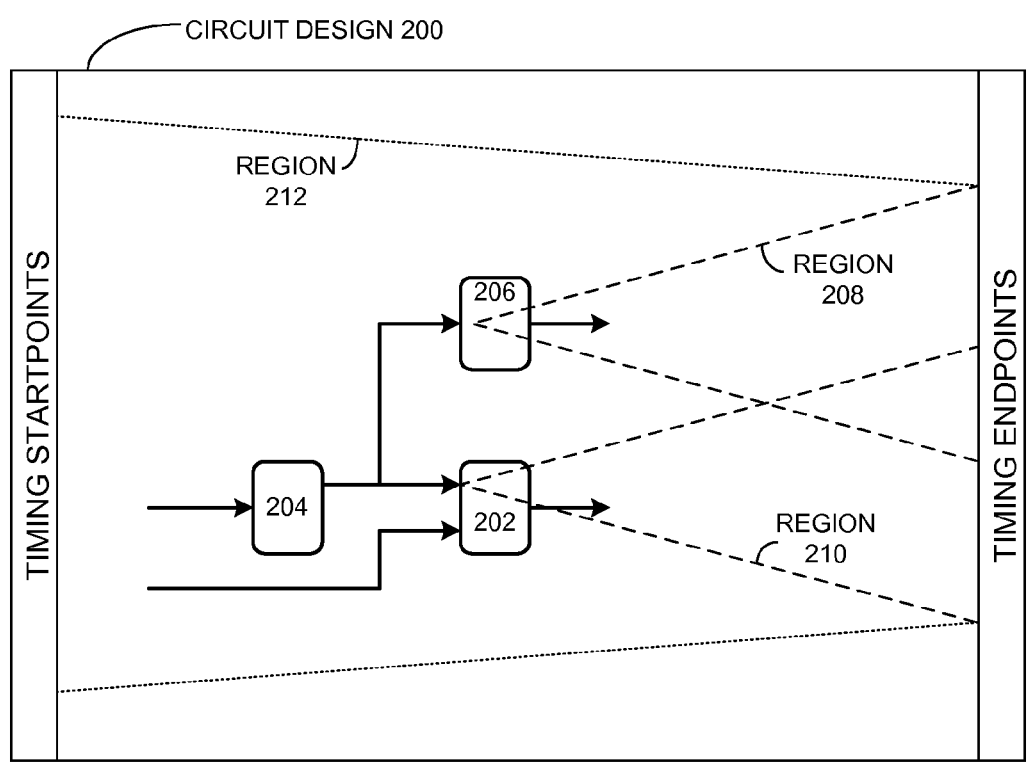
FIG. 2 illustrates how timing information is propagated in a circuit design.

FIG. 2 illustrates how timing information is propagated in a circuit design.

Circuit design 200 includes logic gate 202. Applying an optimization transformation to logic gate 202 can change the capacitive load on logic gate 204, which can change the arrival and transition times at logic gate 204's output, logic gate 202's input, and logic gate 206's input. This change in timing information can ripple through regions 208 and 210 to the timing endpoints of circuit design 200. Note that a timing endpoint can be a register or a primary output or any point in the circuit design where a timing requirement is enforced. Changing the timing information at the timing endpoints of the design causes the required times in the entire fan-in cones of all these timing endpoints to be out-of-date. Hence, after propagating the timing information in the forward direction, conventional systems typically propagate required times backwards, e.g., backwards along region 212 all the way to the timing startpoints. General information on static timing analysis and propagation of timing information can be found in Luciano Lavagno (Editor), Louis Scheffer (Editor), Grant Martin (Editor), *EDA for IC Implementation, Circuit Design, and Process Technology* (Electronic Design Automation for Integrated Circuits Handbook), CRC Press, 1$^{st}$ Ed., March 2006.

To summarize, conventional approaches ensure a valid local context by forcing a timing update of the entire design whenever a change to a logic gate is accepted. Since all timing is updated, this guarantees that the local context for next logic gate or cell will be valid regardless of the location of the logic gate or cell. Note that most of the computation is wasted because the next logic gate that is visited will most likely change timing again.

Updating arrival and required times for the entire circuit is computationally expensive. In fact, the worst-case complexity of a full timing update can be exponential with respect to the circuit design's size. As a result, the timing update operation can become a runtime bottleneck in a conventional synthesis optimization system (e.g., logic synthesis and physical synthesis).

Conventional techniques typically impose a time limit on the optimization process to combat the runtime bottleneck problem. In other words, the system tries to optimize the entire circuit design, but terminates the process after a predetermined amount of time. Although this approach ensures that the optimization process is guaranteed to terminate within the predetermined amount of time, it can result in poor QoR.

The long runtime and poor QoR problems are further exacerbated when a design needs to be optimized for a large number of multi-mode multi-corner (MCMM) scenarios. Advances to lower semiconductor geometries have increased the variability in process, voltage, and temperature. Implementation tools need to ensure that a design operates reliably (i.e., meets its functional and performance goals) under multiple process and operating corners. At the same time, increasing design complexity has introduced a large number of operational modes for a design (such as stand-by, mission, test, BIST, etc.). Hence, implementation tools also need to ensure that a design meets its desired performance objectives under all modes of operation. The number of modes and corners in a design continue to grow in each new semiconductor technology node and new design. The term "MCMM scenario" refers to a particular combination of a mode and a corner.

An optimal implementation solution that can handle the increasing number of MCMM scenarios demands simultaneous and concurrent optimization of all design objectives (timing, power, area, etc.) under the constraints that are imposed by all scenarios. Traditional approaches that optimize each scenario independently suffer from poor quality of results and a very long runtimes in converging on an optimal solution for all scenarios. Very often, they fail to converge on an optimal solution. Conventional techniques repeatedly update the timing, power, and electrical design rules of all scenarios every time it applies transformations to the various gates in the design. Therefore, the MCMM scenarios exacerbate the long runtime and poor QoR problems of conventional optimization techniques. Hence, what is needed are efficient circuit optimization techniques which produce good QoR.

Figure 3A:
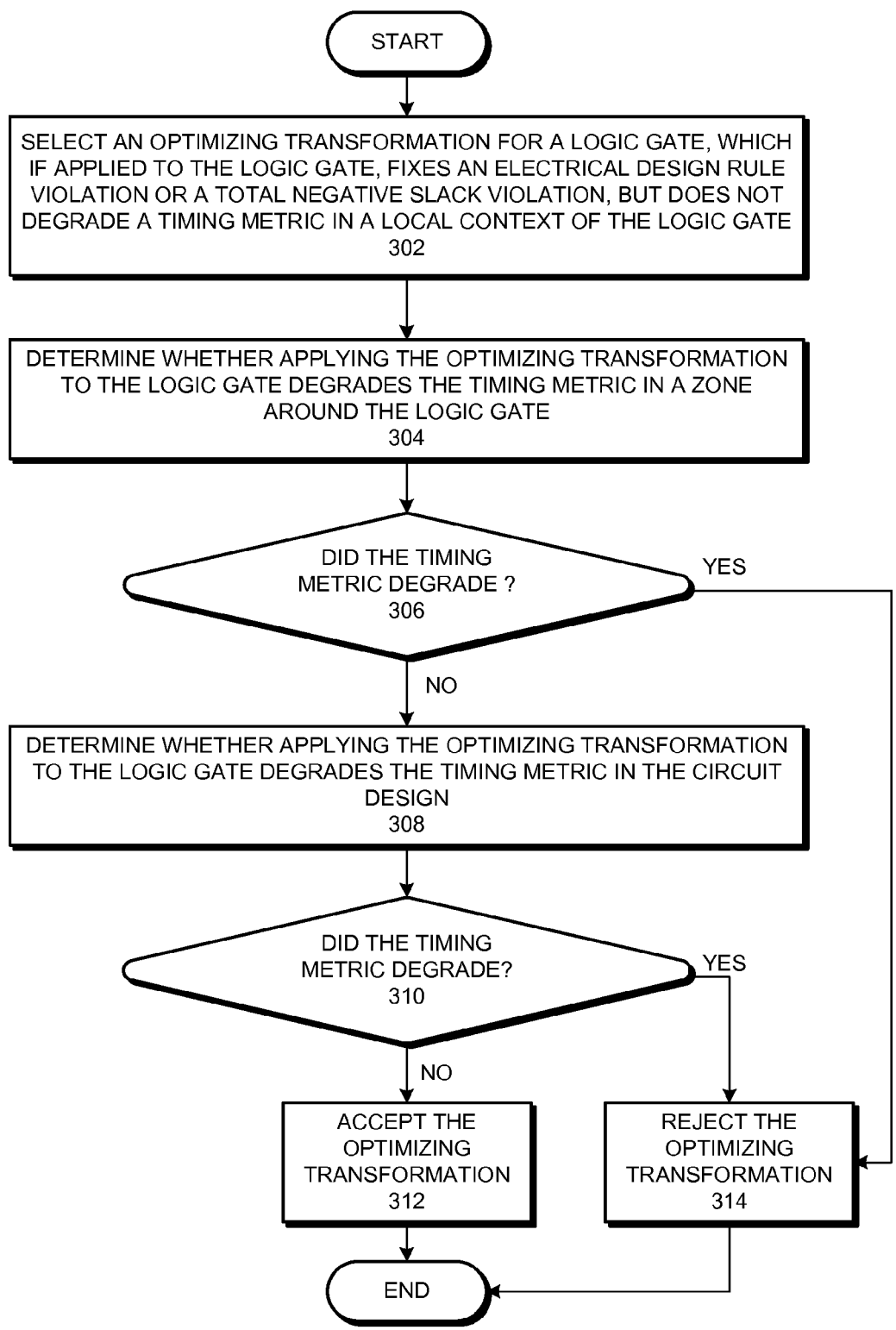
FIG. 3A presents a flowchart that illustrates a process for optimizing a circuit design in accordance with some embodiments of the present invention.

FIG. 3A presents a flowchart that illustrates a process for optimizing a circuit design in accordance with some embodiments of the present invention.

A system can select an optimizing transformation for a logic gate, which if applied to the logic gate, fixes an electrical design rule violation or a total negative slack violation, but does not degrade a timing metric in a local context of the logic gate (step 302).

The timing metric can be a worst negative slack metric, a total negative slack metric, a maximum transition time metric, or a combination of one or more of these metrics. The optimizing transformation can be used for improving metrics or for fixing violations. Specifically, the optimizing transformation can intended to fix a worst negative slack violation, a total negative slack violation, a maximum transition time violation, and/or a maximum capacitance violation.

Next, the system can determine whether applying the optimizing transformation to the logic gate degrades the timing metric in a zone around the logic gate (step 304).

If the system determines that applying the optimizing transformation to the logic gate degrades the timing metric in the zone ("YES" branch of step 306), the system can reject the optimizing transformation (step 314).

On the other hand, if the system determines that applying the optimizing transformation to the logic gate does not degrade the timing metric in the zone ("NO" branch of step 306), the system can determine whether applying the optimizing transformation to the logic gate degrades the timing metric in the circuit design (step 308).

If the system determines that applying the optimizing transformation to the logic gate degrades the timing metric in the circuit design ("YES" branch of step 310), the system can reject the optimizing transformation (step 314).

On the other hand, if system determines that applying the optimizing transformation to the logic gate does not degrade the timing metric in the circuit design ("NO" branch of step 310), the system can accept the optimizing transformation (step 312).

Figure 3B:
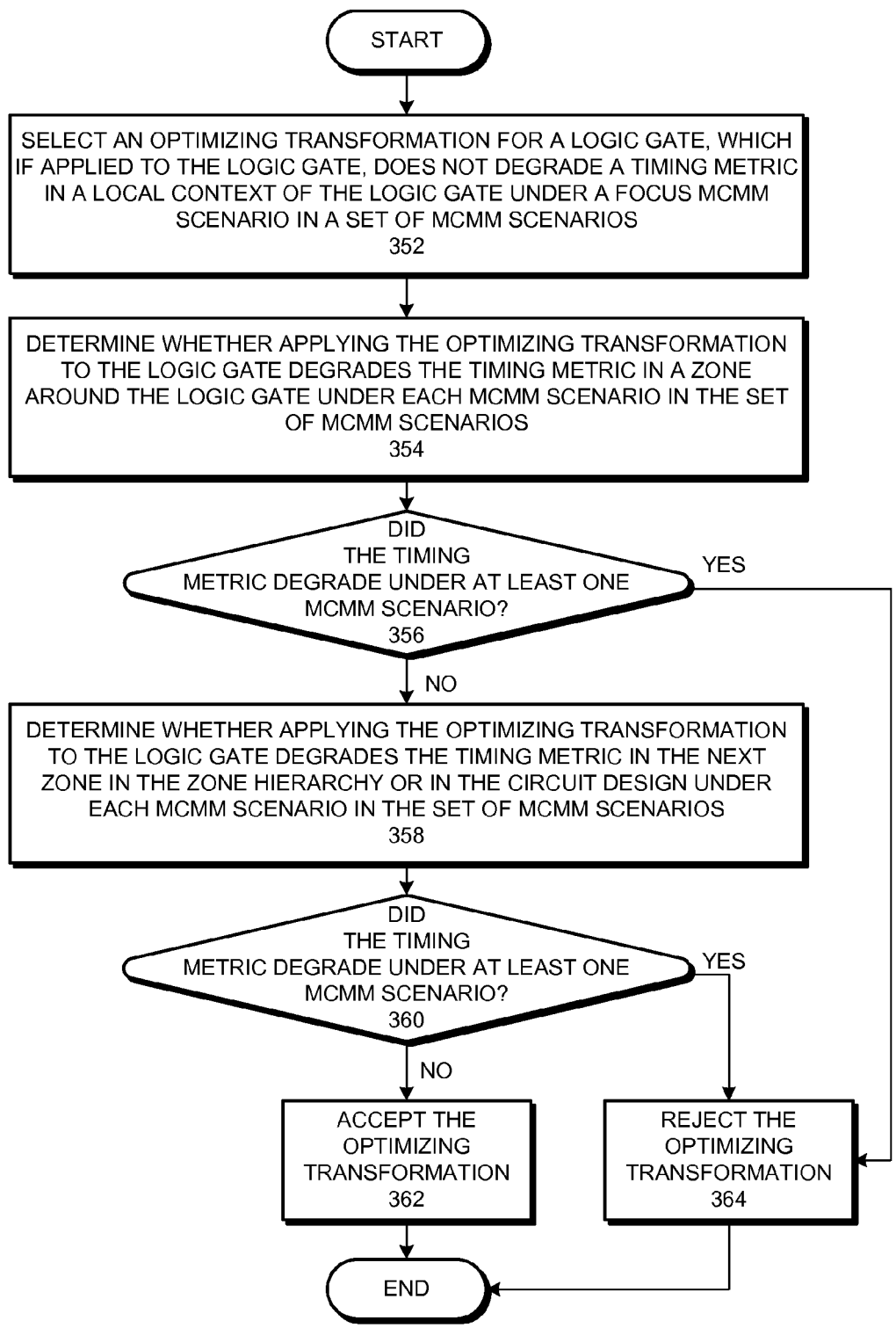
FIG. 3B presents a flowchart that illustrates a process for optimizing a circuit design for a set of multi-mode multi-corner (MCMM) scenarios in accordance with some embodiments of the present invention.

FIG. 3B presents a flowchart that illustrates a process for optimizing a circuit design for a set of MCMM scenarios in accordance with some embodiments of the present invention.

A system can select an optimizing transformation for a logic gate, which if applied to the logic gate, does not degrade a timing metric in a local context of the logic gate under a focus MCMM scenario in a set of MCMM scenarios (step 352). Note that, by limiting itself to only the focus MCMM scenario, the system can try a much larger number of optimizing transformations in the local context. The focus scenario can be chosen based on a variety of criteria. For example, for fixing timing violations, the focus scenario can be the one in which the timing violation occurred.

Next, the system can determine whether applying the optimizing transformation to the logic gate degrades the timing metric in a zone around the logic gate under each MCMM scenario in the set of MCMM scenarios (step 354).

If the system determines that applying the optimizing transformation to the logic gate degrades the timing metric in the zone under at least one MCMM scenario ("YES" branch of step 356), the system can reject the optimizing transformation (step 364).

On the other hand, if the system determines that applying the optimizing transformation to the logic gate does not degrade the timing metric in the zone under any MCMM scenario in the set of MCMM scenarios ("NO" branch of step 356), the system can determine whether applying the optimizing transformation to the logic gate degrades the timing metric in the next zone in the zone hierarchy or in the circuit design under each MCMM scenario in the set of MCMM scenarios (step 358). Note that if the system uses a hierarchy of zones, then the process will iterate over step 358 multiple times for each zone in the hierarchy. If the timing metrics do not degrade for any of the zones in the zone hierarchy, the system will then check the timing metrics in the circuit design.

If the system determines that applying the optimizing transformation to the logic gate degrades the timing metric in the circuit design under at least one MCMM scenario ("YES" branch of step 360), the system can reject the optimizing transformation (step 364).

On the other hand, if the system determines that applying the optimizing transformation to the logic gate does not degrade the timing metric in the circuit design under any MCMM scenario in the set of MCMM scenarios ("NO" branch of step 360), the system can accept the optimizing transformation (step 362).

Figure 3C:
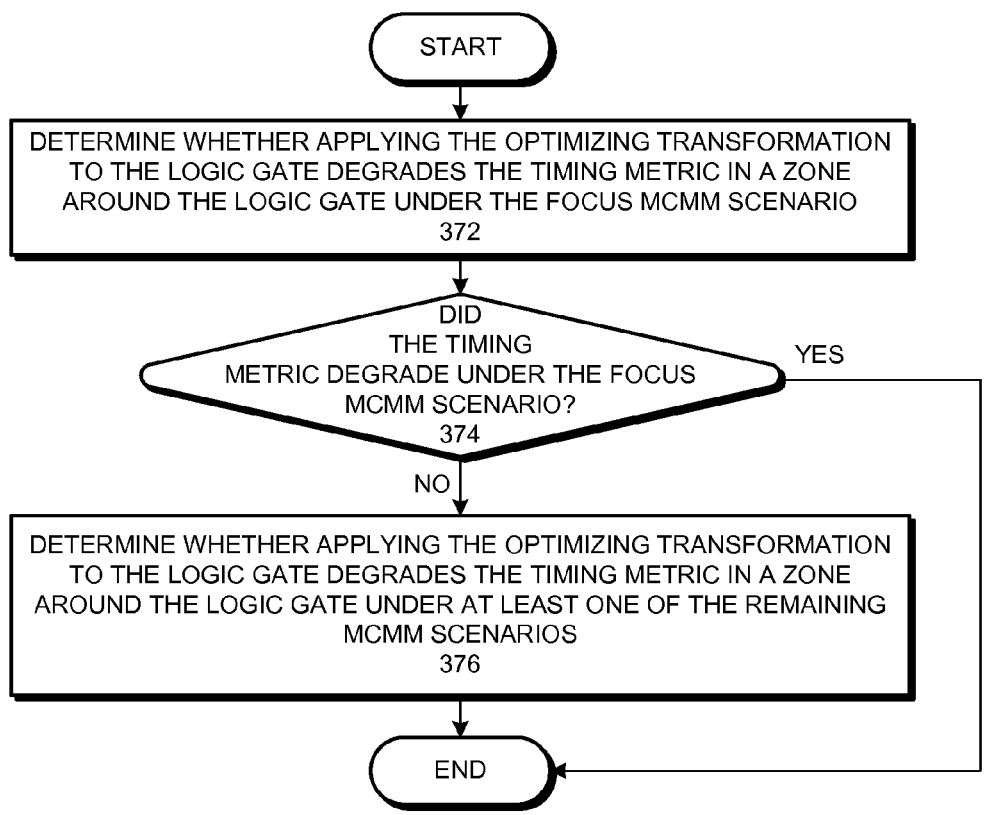
FIG. 3C presents a flowchart that illustrates a process for determining whether applying the optimizing transformation to the logic gate degrades the timing metric in a zone around the logic gate under the set of MCMM scenarios in accordance with an embodiment of the present invention.

FIG. 3C presents a flowchart that illustrates a process for determining whether applying the optimizing transformation to the logic gate degrades the timing metric in a zone around the logic gate under the set of MCMM scenarios in accordance with an embodiment of the present invention.

Note that the process shown in FIG. 3C can be performed during step 354 in FIG. 3B. The system can determine whether applying the optimizing transformation to the logic gate degrades the timing metric in a zone around the logic gate under the focus MCMM scenario (step 372). Next, the system can check if the timing metrics degraded (step 374). If the timing metric degraded ("YES" branch of step 374), the system can report that the timing metrics degraded for at least one MCMM scenario. On the other hand, if the timing metric does not degrade ("NO" branch of step 374), the system can then determine whether applying the optimizing transformation to the logic gate degrades the timing metric in a zone around the logic gate under at least one of the remaining MCMM scenarios (step 376). The system can use a similar process during step 358 in FIG. 3B to determine whether applying the optimizing transformation to the logic gate degrades the timing metric in the circuit design at least one MCMM scenario in the set of MCMM scenarios.

Note that oftentimes the timing metrics, e.g., worst negative slack and total negative slack remain the same, i.e., they do not degrade, but they also do not improve. In such situations, the system can break the tie based on other metrics. For example, the system may reject the optimizing transformation if the timing metrics remain the same, but an electrical design rule metric (e.g., maximum capacitance or maximum transition), or a hold metric (e.g., minimum delay metric) degrades. Conversely, the system may accept the optimizing transformation if the timing metric remains the same, but an electrical design rule metric, or a hold metric improves. The system can also create a cost vector based on these metrics and use the vector to determine whether to accept or reject the optimizing transformation.

Figure 4A:
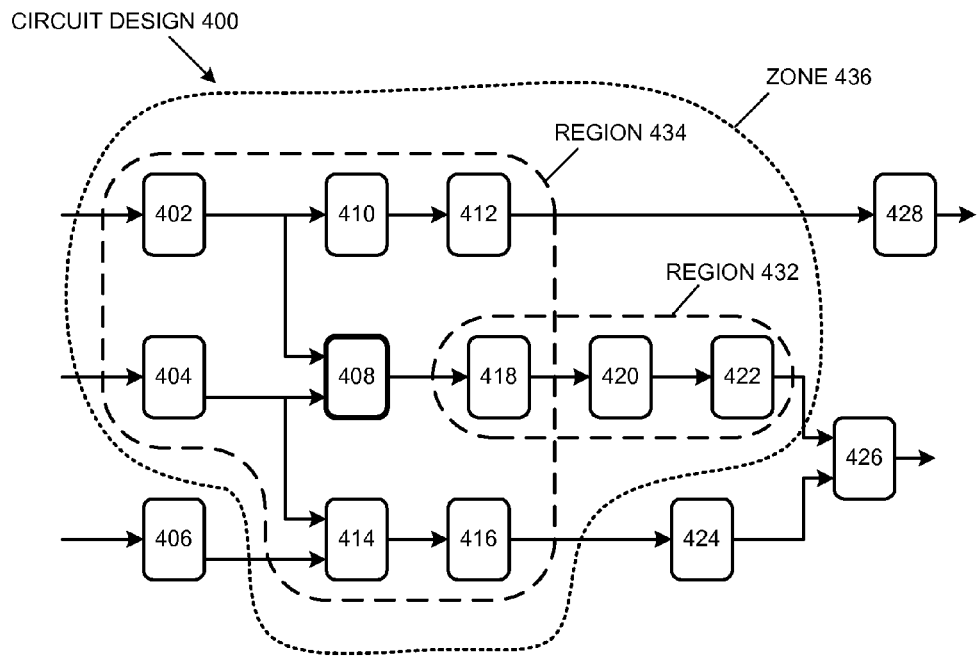
FIG. 4A illustrates a zone around a logic gate in accordance with some embodiments of the present invention.

FIG. 4A illustrates a zone around a logic gate in accordance with some embodiments of the present invention.

Circuit design 400 includes logic gates 402-428. Let us assume that logic gate 408 is being optimized. As mentioned above, a zone around logic gate 408 can generally include any arbitrary portion of the circuit design which includes logic gate 408. In the example shown in FIG. 4, zone 436 includes logic gates which are within three levels of logic gate 408's fan-out (region 432 which includes logic gates 418-422), logic gate 408's fan-ins (logic gates 402 and 404), and logic gates which are within two levels of logic gate 408's fan-in's fan-out (region 434, which includes logic gates 408-416). The endpoints of zone 436 are the output terminals of logic gates 412, 422, and 416.

After applying an optimizing transformation to logic gate 408, the system can propagate timing information within zone 436. Since the arrival times and transition times are only propagated within the zone (as opposed to being propagated through the entire network), it substantially reduces the amount of computation required for propagating timing information.

Once the timing information is propagated within zone 436, the system can compute timing metric(s) using the arrival times and required times. If the optimizing transformation does not degrade the timing metric(s), the system can then determine whether applying the optimizing transformation would degrade timing metric(s) in the circuit design. Specifically, the system can propagate the arrival times to the timing endpoints of the circuit design, and then compute timing metric(s) at the timing endpoints of the circuit design using the arrival times and required times. If the system accepts the optimizing transformation, the system can then update the required times by propagating them backwards from the timing endpoints of the circuit design to the timing startpoints of the circuit design.

Figure 4B:
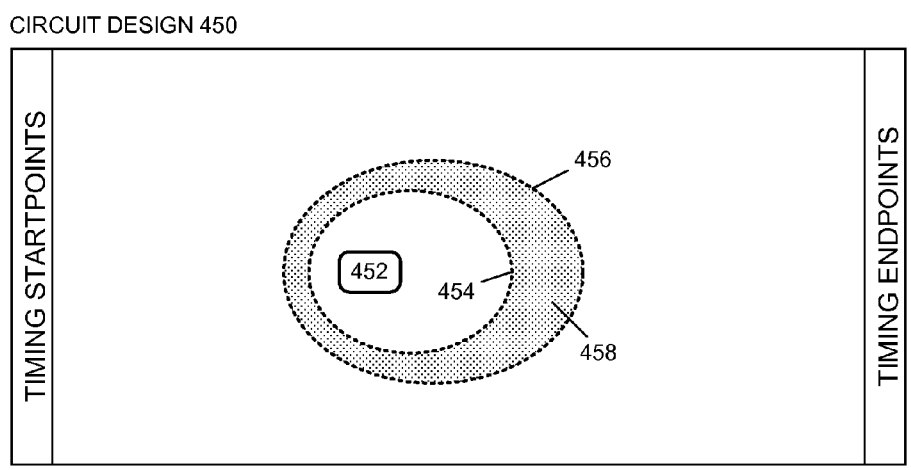
FIG. 4B illustrates a hierarchy of zones in accordance with some embodiments of the present invention.

FIG. 4B illustrates a hierarchy of zones in accordance with some embodiments of the present invention.

Circuit design 450 includes logic gate 452 which is being optimized. Instead of creating only one zone, the system can create a hierarchy of zones. For example, the system can create a small zone 454 around logic gate 452 and a larger zone 456 which includes zone 454. The system can use the hierarchy of zones to check degradation of timing metrics. Specifically, the system can begin by checking timing metrics in the local context. If the timing metrics degrade, the system can reject the optimizing transformation. Otherwise, the system can check timing metrics in the smallest zone in the hierarchy of zones. If the timing metrics degrade at this stage, the system can reject the optimizing transformation. Otherwise, the system can proceed to the next largest zone in the zone hierarchy, and so forth.

In some embodiments of the present invention, when the system proceeds from one zone to the next zone in the hierarchy, the system only updates timing information in the new logic gates that are in the larger zone, but not in the smaller zone. For example, suppose the timing metrics do not degrade in zone 454, and now the system wants to check the timing metrics in zone 456. Before computing the timing metric, the system updates the timing information in region 458 which lies between the two zones. By performing such incremental timing updates, the system substantially reduces the amount of timing updates that are required from one zone to the next.

Figure 5:
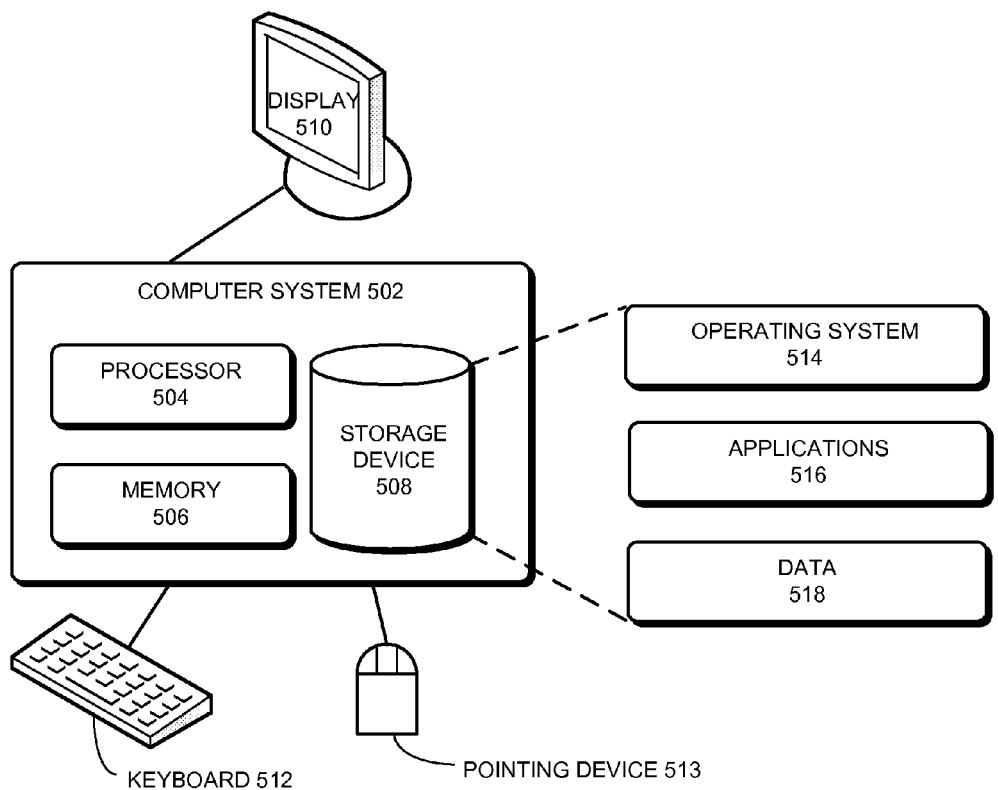
FIG. 5 illustrates a computer system in accordance with some embodiments of the present invention.

FIG. 5 illustrates a computer system in accordance with some embodiments of the present invention.

Computer system 502 includes a processor 504, a memory 506, and a storage device 508. Furthermore, computer system 502 can be coupled to a display device 510, a keyboard 512, and a pointing device 513. Storage device 508 can store operating system 514, applications 516, and data 518.

Applications 516 can include instructions, which when executed by computer system 502, can cause computer system 502 to perform methods and/or processes described in this disclosure. Data 518 can include any data that is required as input or that is generated as output by the methods and/or processes described in this disclosure.

Figure 6:
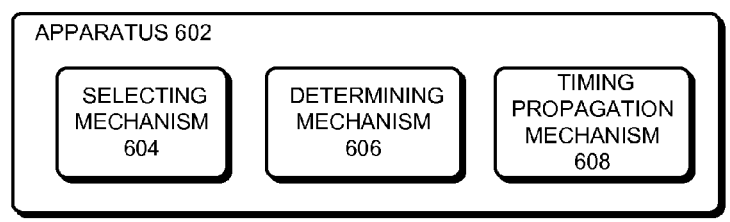
FIG. 6 illustrates an apparatus in accordance with some embodiments of the present invention.

FIG. 6 illustrates an apparatus in accordance with some embodiments of the present invention.

Apparatus 602 can comprise a plurality of mechanisms which may communicate with one another via a wired or wireless communication channel. Apparatus 602 may be realized using one or more integrated circuits, and apparatus 602 may include fewer or more mechanisms than those shown in FIG. 6. Further, apparatus 602 may be integrated in a computer system, or it may be realized as a separate device which is capable of communicating with other computer systems and/or devices.

Specifically, apparatus 602 can include selecting mechanism 604, determining mechanism 606, and timing propagation mechanism 608. Selecting mechanism 604 can be configured to process logic gates in a particular processing order, and select an optimizing transformation for a logic gate, or perform any other tasks related to these tasks as disclosed in this disclosure. Determining mechanism 606 can be configured to determine timing metrics, and determine whether the optimizing transformation should be accepted or rejected, or perform any other tasks related to these tasks as disclosed in this disclosure. Timing propagation mechanism 608 can be configured to propagate timing information or perform any other tasks related to these tasks as disclosed in this disclosure.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for optimizing a circuit design, the method comprising:

selecting an optimizing transformation for a logic gate, which if applied to the logic gate, does not degrade a timing metric in a local context of the logic gate under a focus multi-mode multi-corner (MCMM) scenario in a set of MCMM scenarios;

determining, by computer, whether applying the optimizing transformation to the logic gate degrades the timing metric in a zone around the logic gate under each MCMM scenario in the set of MCMM scenarios, wherein the zone around the logic gate includes the local context of the logic gate and at least one additional logic gate;

in response to determining that applying the optimizing transformation to the logic gate degrades the timing metric in the zone under at least one MCMM scenario, rejecting the optimizing transformation; and in response to determining that applying the optimizing transformation to the logic gate does not degrade the timing metric in the zone under any MCMM scenario in the set of MCMM scenarios, determining whether applying the optimizing transformation to the logic gate degrades the timing metric in the circuit design under each MCMM scenario in the set of MCMM scenarios, and accepting the optimizing transformation if the logic gate does not degrade the timing metric in the circuit design under any MCMM scenario in the set of MCMM scenarios.

2. The computer-implemented method of claim 1, wherein the zone includes the logic gate, the logic gate's fan-in, logic gates within a first predetermined number of levels in the logic gate's fan-out, and a second predetermined number of levels in the logic gate's fan-in's fan-out.

3. The computer-implemented method of claim 1, wherein determining whether applying the optimizing transformation to the logic gate degrades the timing metric in a zone around the logic gate under each MCMM scenario in the set of MCMM scenarios includes iteratively checking the timing metric in a hierarchy of zones.

4. The computer-implemented method of claim 1, wherein determining whether applying the optimizing transformation to the logic gate degrades the timing metric in the zone around the logic gate under each MCMM scenario in the set of MCMM scenarios includes:

determining whether applying the optimizing transformation to the logic gate degrades the timing metric in the zone around the logic gate under a focus MCMM scenario in the set of MCMM scenarios; and determining whether applying the optimizing transformation to the logic gate degrades the timing metric in the zone around the logic gate under the remaining MCMM scenarios in the set of MCMM scenarios.

5. The computer-implemented method of claim 1, wherein the timing metric is a worst negative slack metric.

6. The computer-implemented method of claim 1, wherein the timing metric is a total negative slack metric.

7. The computer-implemented method of claim 1, wherein the timing metric is a maximum transition time metric.

8. A non-transitory computer-readable storage medium storing instructions that when executed by a computer cause the computer to perform a method for optimizing a circuit design, the method comprising:

selecting an optimizing transformation for a logic gate, which if applied to the logic gate, does not degrade a timing metric in a local context of the logic gate under a focus multi-mode multi-corner (MCMM) scenario in a set of MCMM scenarios;

determining whether applying the optimizing transformation to the logic gate degrades the timing metric in a zone around the logic gate under each MCMM scenario in the set of MCMM scenarios, wherein the zone around the logic gate includes the local context of the logic gate and at least one additional logic gate;

in response to determining that applying the optimizing transformation to the logic gate degrades the timing metric in the zone under at least one MCMM scenario, rejecting the optimizing transformation; and in response to determining that applying the optimizing transformation to the logic gate does not degrade the timing metric in the zone under any MCMM scenario in the set of MCMM scenarios, determining whether applying the optimizing transformation to the logic gate degrades the timing metric in the circuit design under each MCMM scenario in the set of MCMM scenarios, and accepting the optimizing transformation if the logic gate does not degrade the timing metric in the circuit design under any MCMM scenario in the set of MCMM scenarios.

9. The non-transitory computer-readable storage medium of claim 8, wherein the zone includes the logic gate, the logic gate's fan-in, logic gates within a first predetermined number of levels in the logic gate's fan-out, and a second predetermined number of levels in the logic gate's fan-in's fan-out.

10. The non-transitory computer-readable storage medium of claim 8, wherein determining whether applying the optimizing transformation to the logic gate degrades the timing metric in the zone around the logic gate under each MCMM scenario in the set of MCMM scenarios includes iteratively checking the timing metric in a hierarchy of zones.

11. The non-transitory computer-readable storage medium of claim 8, wherein determining whether applying the optimizing transformation to the logic gate degrades the timing metric in the zone around the logic gate under each MCMM scenario in the set of MCMM scenarios includes:

determining whether applying the optimizing transformation to the logic gate degrades the timing metric in the zone around the logic gate under a focus MCMM scenario in the set of MCMM scenarios; and determining whether applying the optimizing transformation to the logic gate degrades the timing metric in the zone around the logic gate under the remaining MCMM scenarios in the set of MCMM scenarios.

12. The non-transitory computer-readable storage medium of claim 8, wherein the timing metric is a worst negative slack metric.

13. The non-transitory computer-readable storage medium of claim 8, wherein the timing metric is a total negative slack metric.

14. The non-transitory computer-readable storage medium of claim 8, wherein the timing metric is a maximum transition time metric.

15. A computer-implemented method for optimizing a circuit design, the method comprising:

selecting an optimizing transformation for a logic gate, which if applied to the logic gate, fixes an electrical design rule violation, but does not degrade a timing metric in a local context of the logic gate;

determining, by computer, whether applying the optimizing transformation to the logic gate degrades the timing metric in a zone around the logic gate, wherein the zone around the logic gate includes the local context of the logic gate and at least one additional logic gate;

in response to determining that applying the optimizing transformation to the logic gate degrades the timing metric in the zone, rejecting the optimizing transformation; and in response to determining that applying the optimizing transformation to the logic gate does not degrade the timing metric in the zone, determining whether applying the optimizing transformation to the logic gate degrades the timing metric in the circuit design, and accepting the optimizing transformation if the logic gate does not degrade the timing metric in the circuit design.

16. The method of claim 15, wherein the zone includes the logic gate, the logic gate's fan-in, logic gates within a first predetermined number of levels in the logic gate's fan-out, and a second predetermined number of levels in the logic gate's fan-in's fan-out.

17. The method of claim 15, wherein determining whether applying the optimizing transformation to the logic gate degrades the timing metric in a zone around the logic gate includes iteratively checking the timing metric in a hierarchy of zones.

18. A computer-implemented method for optimizing a circuit design, the method comprising:

selecting an optimizing transformation for a logic gate, which if applied to the logic gate, fixes a total negative slack violation, but does not degrade a timing metric in a local context of the logic gate;

determining, by computer, whether applying the optimizing transformation to the logic gate degrades the timing metric in a zone around the logic gate, wherein the zone around the logic gate includes the local context of the logic gate and at least one additional logic gate;

in response to determining that applying the optimizing transformation to the logic gate degrades the timing metric in the zone, rejecting the optimizing transformation; and in response to determining that applying the optimizing transformation to the logic gate does not degrade the timing metric in the zone, determining whether applying the optimizing transformation to the logic gate degrades the timing metric in the circuit design, and accepting the optimizing transformation if the logic gate does not degrade the timing metric in the circuit design.

19. The method of claim 18, wherein the zone includes the logic gate, the logic gate's fan-in, logic gates within a first predetermined number of levels in the logic gate's fan-out, and a second predetermined number of levels in the logic gate's fan-in's fan-out.

20. The method of claim 18, wherein determining whether applying the optimizing transformation to the logic gate degrades the timing metric in a zone around the logic gate includes iteratively checking the timing metric in a hierarchy of zones.

\* \* \* \* \*